(12) United States Patent
Puri et al.

(10) Patent No.: US 12,431,192 B2
(45) Date of Patent: Sep. 30, 2025

(54) SEMICONDUCTOR DEVICE

(71) Applicant: Taiwan Semiconductor Manufacturing Company, Ltd., Hsinchu (TW)

(72) Inventors: Nikhil Puri, Hsinchu (TW); Venkateswara Reddy Konudula, Hsinchu (TW); Teja Masina, Hsinchu (TW); Yen-Huei Chen, Hsinchu County (TW); Hung-Jen Liao, Hsinchu (TW); Hidehiro Fujiwara, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 300 days.

(21) Appl. No.: 18/189,331

(22) Filed: Mar. 24, 2023

(65) Prior Publication Data
US 2024/0079052 A1 Mar. 7, 2024

Related U.S. Application Data

(60) Provisional application No. 63/403,946, filed on Sep. 6, 2022.

(51) Int. Cl.
*G11C 11/419* (2006.01)

(52) U.S. Cl.
CPC ................. *G11C 11/419* (2013.01)

(58) Field of Classification Search
CPC .................................... G11C 11/16
See application file for complete search history.

(56) References Cited

U.S. PATENT DOCUMENTS

2012/0044736 A1* 2/2012 Chung .............. G11C 13/0069
365/72

* cited by examiner

*Primary Examiner* — Jason Lappas
(74) *Attorney, Agent, or Firm* — Birch, Stewart, Kolasch & Birch, LLP

(57) ABSTRACT

A semiconductor device includes a first memory bank, a second memory bank and a first write driver. The first memory bank is coupled to a plurality of first data lines, and configured to operate according to a first data signal. The second memory bank is configured to operate according to the first data signal. The first write driver is disposed between the first memory bank and the second memory bank, and configured to adjust a voltage level of one of the plurality of first data lines when the first memory bank is written according to the first data signal.

20 Claims, 7 Drawing Sheets

SEMICONDUCTOR DEVICE

CROSS-REFERENCE TO RELATED APPLICATION

This application claims priority benefit of U.S. Provisional Application Ser. No. 63/403,946, filed Sep. 6, 2022, the full disclosures of which are incorporated herein by reference.

BACKGROUND

Memory density of a semiconductor device is one of the key aspects during scaling to lower technology nodes. As static random access memory (SRAM) occupies around 70% of system on chip (SOC) area in some of the applications, circuits, architectures, and/or floorplans needs to be designed by keeping area efficiency as key parameter.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
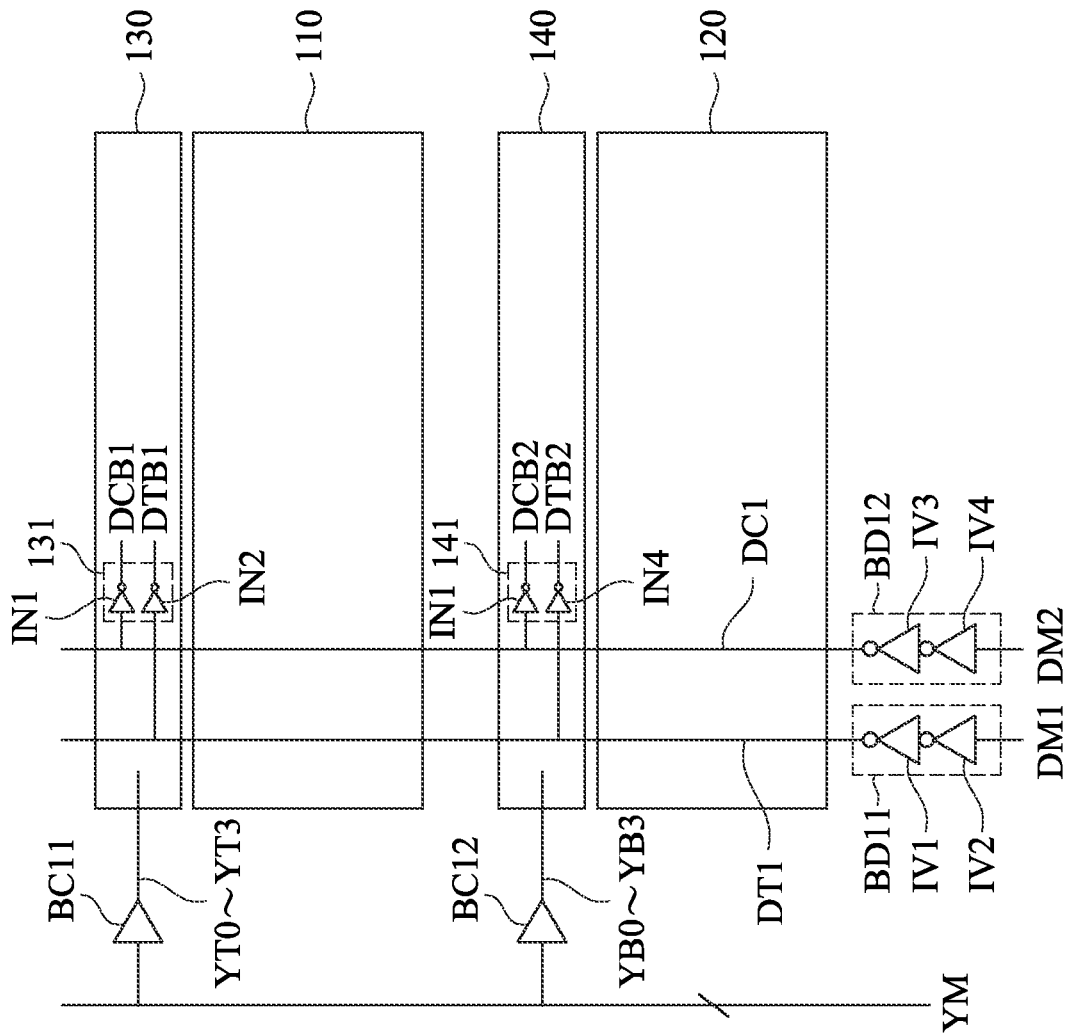
FIG. 1A is a schematic diagram of a semiconductor device, in accordance with some embodiments of the present disclosure.

The following disclosure provides many different embodiments, or examples, for implementing different features of the provided subject matter. Specific examples of components, materials, values, steps, arrangements or the like are described below to simplify the present disclosure. These are, of course, merely examples and are not intended to be limiting. Other components, materials, values, steps, arrangements or the like are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. The term mask, photolithographic mask, photomask and reticle are used to refer to the same item.

The terms applied throughout the following descriptions and claims generally have their ordinary meanings clearly established in the art or in the specific context where each term is used. Those of ordinary skill in the art will appreciate that a component or process may be referred to by different names. Numerous different embodiments detailed in this specification are illustrative only, and in no way limits the scope and spirit of the disclosure or of any exemplified term.

It is worth noting that the terms such as "first" and "second" used herein to describe various elements or processes aim to distinguish one element or process from another. However, the elements, processes and the sequences thereof should not be limited by these terms. For example, a first element could be termed as a second element, and a second element could be similarly termed as a first element without departing from the scope of the present disclosure.

In the following discussion and in the claims, the terms "comprising," "including," "containing," "having," "involving," and the like are to be understood to be open-ended, that is, to be construed as including but not limited to. As used herein, instead of being mutually exclusive, the term "and/or" includes any of the associated listed items and all combinations of one or more of the associated listed items.

FIG. 1A is a schematic diagram of a semiconductor device 100, in accordance with some embodiments of the present disclosure. In some embodiments, FIG. 1A corresponds to a layout view of the semiconductor device 100.

In some embodiments, the semiconductor device 100 includes multiple memory banks and multiple write drivers for assisting write operations of the memory banks. As illustratively shown in FIG. 1A, the semiconductor device 100 includes memory banks 110, 120, write drivers 130, 140 and buffers BC11, BC12, BD11, BD12. In some embodiments, the memory banks 110 and 120 correspond to static random access memory (SRAM).

As illustratively shown in FIG. 1A, a buffer group including the buffers BC11, BC12 and a write driver group including the write drivers 130, 140 are formed to be arranged in order along a first direction, such as an X direction shown in FIG. 1A. A buffer group including the buffers BD11, BD12, the memory bank 120, the write driver 140, the memory bank 110 and the write driver 130 are formed to be arranged in order along a second direction different from the first direction, such as a Y direction shown in FIG. 1A. In some embodiments, the Y direction and the X direction are perpendicular from each other. In some embodiments, the buffers BD11 and BD12 are included in a main input/output device (not shown in figures). In some embodiments, the semiconductor device 100 includes more memory banks and write drivers arranged alternately along the Y direction.

As illustratively shown in FIG. 1A, the buffer BC11 is configured to generate control signals YT0-YT3 according to a control signal YM. The buffer BC12 is configured to generate control signals YB0-YB3 according to the control signal YM. The buffer BD11 is configured to generate a data signal DT1 according to a data signal DM1. The buffer BD12 is configured to generate a data signal DC1 according to a data signal DM2. In some embodiments, a logic value of the data signal DT1 and a logic value of the data signal DC1 are complementary with each other.

In some embodiments, each of the buffers BD11 and BD12 includes one or more inverter. As illustratively shown in FIG. 1A, the buffer BD11 includes inverters IV1 and IV2 coupled in series. The buffer BD12 includes inverters IV3 and IV4 coupled in series.

Figure 2:
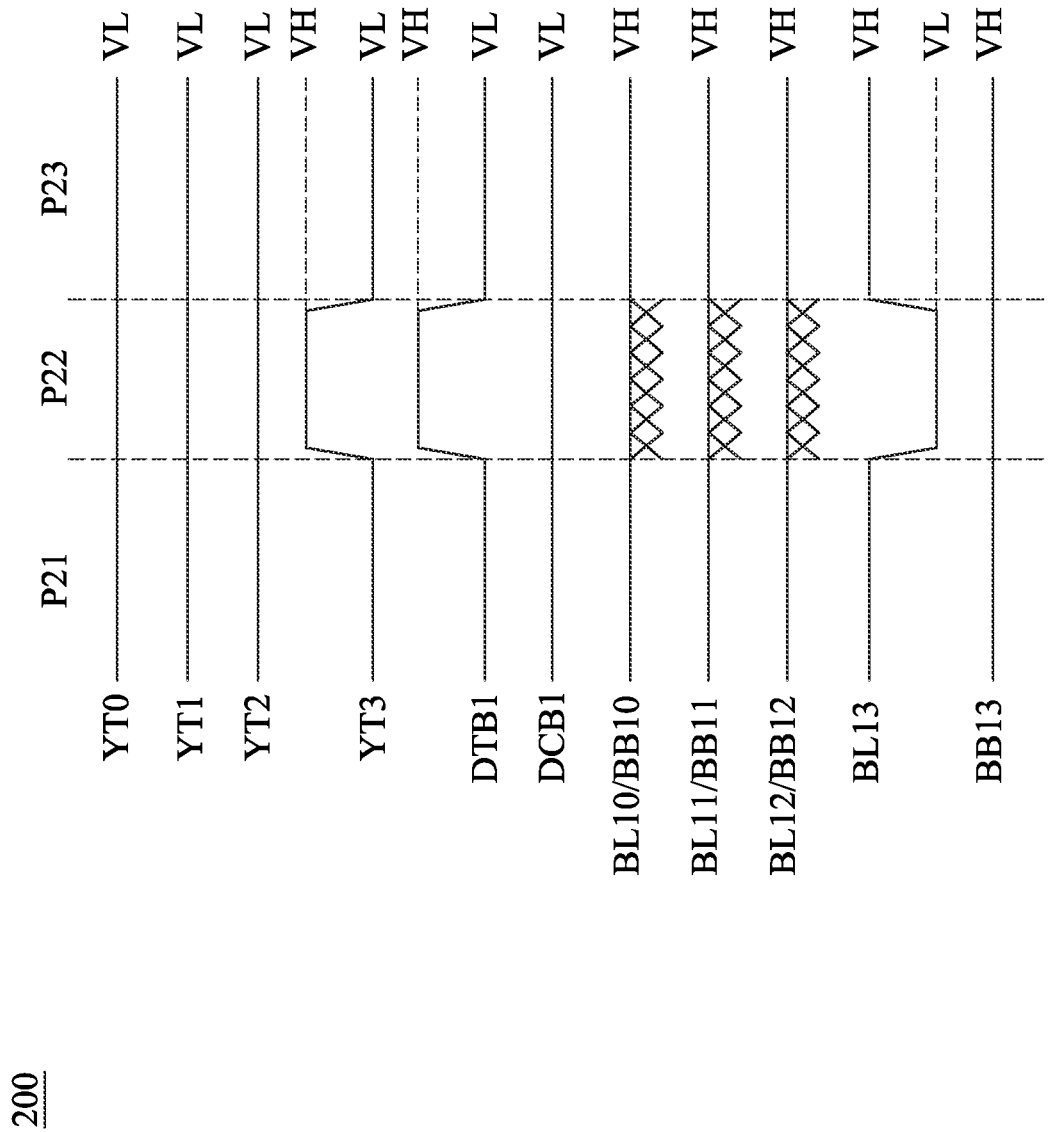
FIG. 2 is a timing diagram associated with the signals of the semiconductor device shown in FIG. 1A, in accordance with some embodiments of the present disclosure.

In some embodiments, each of the memory banks 110 and 120 includes multiple rows, such as 512 rows, of memory cells, and multiple bit lines (such as the bit lines BL10-BL13, BL20-BL23 and the complementary bit lines BB10-BB13, BB20-BB23 shown in FIG. 2) coupled to corresponding ones of the memory cells. The memory cells of the memory banks 110 and 120 are configured to be written according to the data signals DT1 and DC1. In some embodiments, poly-silicon gates of the memory cells of the memory banks 110 and 120 extend along the X direction.

As illustratively shown in FIG. 1A, the write driver 130 includes a logic circuit 131. The logic circuit 131 is configured to generate data signals DTB1 and DCB1 according to the data signals DT1 and DC1. In some embodiments, the logic circuit 131 includes inverters IN1 and IN2. The inverter IN1 is configured to receive the data signal DC1 and output the data signal DCB1. The inverter IN2 is configured to receive the data signal DT1 and output the data signal DTB1. In various embodiments, the logic circuit 131 includes various logic elements.

In some embodiments, the write driver 130 is configured to adjust a voltage level of the bit lines of the memory bank 110 according to the data signals DTB1, DCB1 and the control signals YT0-YT3, when the memory cells coupled to the bit lines are written according to the data signals DT1 and DC1. In some embodiments, the bit lines are configured to transmit data signals, and are referred to as data lines.

As illustratively shown in FIG. 1A, the write driver 140 includes a logic circuit 141. The logic circuit 141 is configured to generate data signals DTB2 and DCB2 according to the data signals DT1 and DC1. In some embodiments, the logic circuit 141 includes inverters IN3 and IN4. The inverter IN3 is configured to receive the data signal DC1 and output the data signal DCB2. The inverter IN4 is configured to receive the data signal DT1 and output the data signal DTB2. In various embodiments, the logic circuit 141 includes various logic elements.

In some embodiments, the write driver 140 is configured to adjust a voltage level of the bit lines of the memory bank 120 according to the data signals DTB2, DCB2 and the control signals YB0-YB3, when the memory cells coupled to the bit lines are written according to the data signals DT1 and DC1.

In some approaches, when memory banks perform write operations, a write driver discharges bit lines of the memory banks to some voltage levels under a threshold voltage level, to assist the write operations. However, for some memory banks separated from the write driver by a distance of one or more memory bank, leakage from the inactive cells and voltage drops of the conductive path cause the write driver cannot discharge the corresponding bit lines under the threshold voltage level properly.

Compared to the above approaches, in some embodiments of the present disclosure, the write driver 130 is configured to adjust the bit lines of the memory bank 110. The write driver 140 is configured to adjust the bit lines of the memory bank 120. Each of the memory banks 110 and 120 has a corresponding write driver located close to the corresponding one of the memory banks 110 and 120. Accordingly, the leakage and the voltage drops are reduced.

Figure 1B:
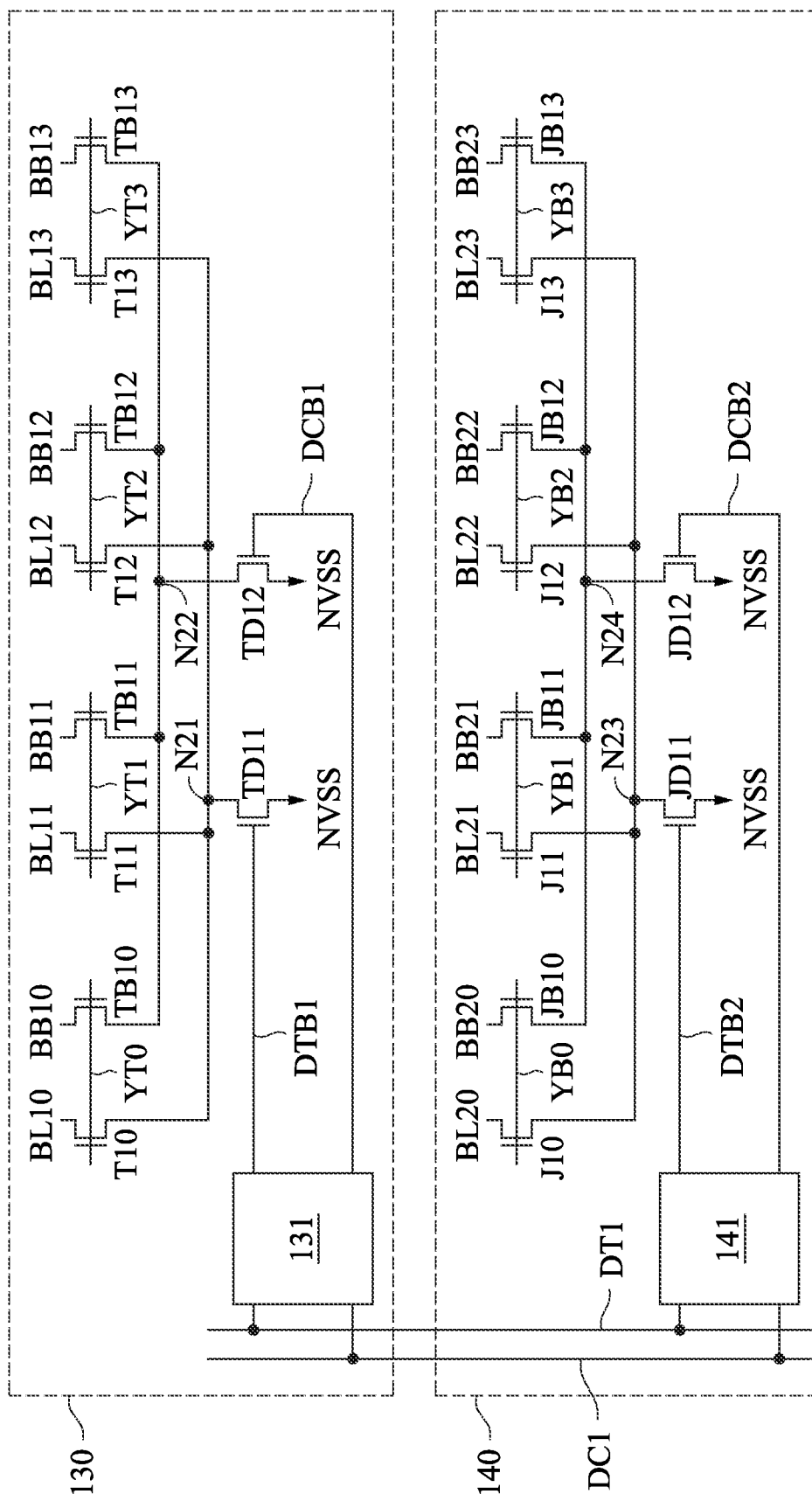
FIG. 1B is a circuit diagram of write drivers of the semiconductor device shown in FIG. 1A, in accordance with some embodiments of the present disclosure.

FIG. 1B is a circuit diagram of the write drivers 130 and 140 of the semiconductor device 100 shown in FIG. 1A, in accordance with some embodiments of the present disclosure. In some embodiments, each of the write drivers 130 and 140 includes multiple switches. As illustratively shown in FIG. 1B, the write driver 130 includes switches T10-T13, TB10-TB13, TD11 and TD12. The write driver 140 includes switches J10-J13, JB10-JB13, JD11 and JD12. In some embodiments, the switches T10-T13, TB10-TB13, TD11, TD12, J10-J13, JB10-JB13, JD11 and JD12 are implemented by N-type metal-oxide semiconductor (NMOS).

As illustratively shown in FIG. 1B, each of first terminals of the switches T10-T13 is coupled to a first terminal of the switch TD11 at a node N21. Second terminals of the switches T10-T13 are coupled to bit lines BL10-BL13, respectively. Each of first terminals of the switches TB10-TB13 is coupled to a first terminal of the switch TD12 at a node N22. Second terminals of the switches TB10-TB13 are coupled to complementary bit lines BB10-BB13, respectively. Each of the second terminals of the switches TD11 and TD12 is configured to receive a reference voltage signal NVSS. In some embodiments, each of the bit lines BL10-BL13 and BB10-BB13 extends along the Y direction shown in FIG. 1A.

In some embodiments, the bit line BL10 is configured to carry a logic value complementary with a logic value carried by the complementary bit line BB10. The bit line BL11 is configured to carry a logic value complementary with a logic value carried by the complementary bit line BB11. The bit line BL12 is configured to carry a logic value complementary with a logic value carried by the complementary bit line BB12. The bit line BL13 is configured to carry a logic value complementary with a logic value carried by the complementary bit line BB13.

As illustratively shown in FIG. 1B, control terminals of the switches T10 and TB10 are coupled to each other and configured to receive the control signal YT0. Control terminals of the switches T11 and TB11 are coupled to each other and configured to receive the control signal YT1. Control terminals of the switches T12 and TB12 are coupled to each other and configured to receive the control signal YT2. Control terminals of the switches T13 and TB13 are coupled to each other and configured to receive the control signal YT3.

As illustratively shown in FIG. 1B, the switches TD11 and TD12 are configured to receive the data signals DTB1 and DCB1, respectively, from the logic circuit 131. Referring to FIG. 1A and FIG. 1B, in some embodiment, a control terminal of the switch TD11 is coupled to an output terminal of the inverter IN2, and a control terminal of the switch TD12 is coupled to an output terminal of the inverter IN1.

Referring to FIG. 1A and FIG. 1B, a first memory cell in the memory bank 110 is coupled to the bit lines BL10 and BB10, and configured to be written according to the data signals DT1, DC1 and bit line signals of the bit lines BL10 and BB10. A second memory cell in the memory bank 110 is coupled to the bit lines BL11 and BB11, and configured to be written according to the data signals DT1, DC1 and bit line signals of the bit lines BL11 and BB11. A third memory cell in the memory bank 110 is coupled to the bit lines BL12 and BB12, and configured to be written according to the data signals DT1, DC1 and bit line signals of the bit lines BL12 and BB12. A fourth memory cell in the memory bank 110 is coupled to the bit lines BL13 and BB13, and configured to be written according to the data signals DT1, DC1 and bit line signals of the bit lines BL13 and BB13.

In some embodiments, the control signals YT10-YT13 indicate write/idle states of corresponding memory cells of the memory bank 110. When one of the control signals YT10-YT13 has a first logic value, corresponding one of the first to fourth memory cells performs a write operation. When one of the control signals YT10-YT13 has a second logic value different from the first logic value, the corresponding one of the first to fourth memory cells is idle. For example, when the control signals YT10-YT13 have logic values of 1, 0, 0, 0, respectively, the first memory cell is written, and each of the second to fourth memory cells is not being written (that is being idle).

In some embodiments, the data signals DTB1 and DCB1 indicate a logic value to be written into one of the first to fourth memory cell. A logic value of the data signal DTB1 is complementary with a logic value of the data signal DCB1. For example, when each of the data signal DTB1 and the control signal YT11 has the logic value of 1, each of the data signals DCB1 and DT1 has the logic value of 0. Correspondingly, the second memory cell coupled to the bit lines BL11 and BB11 is written according to the data signal DT1, and has the logic value of 0. At this moment, each of the switches TD11 and T11 is turned on to provide the reference voltage signal NVSS to the bit line BL11. Accordingly, the voltage level of the bit line BL11 is adjusted to a voltage level VL of the reference voltage signal NVSS.

As illustratively shown in FIG. 1B, each of first terminals of the switches J10-J13 is coupled to a first terminal of the switch JD11 at a node N23. Second terminals of the switches J10-J13 are coupled to bit lines BL20-BL23, respectively. Each of first terminals of the switches JB10-JB13 is coupled to a first terminal of the switch JD12 at a node N24. Second terminals of the switches JB10-JB13 are coupled to complementary bit lines BB20-BB23, respectively. Each of the second terminals of the switches JD11 and JD12 is configured to receive the reference voltage signal NVSS. In some embodiments, each of the bit lines BL20-BL23 and BB20-BB23 extends along the Y direction shown in FIG. 1A.

In some embodiments, the bit line BL20 is configured to carry a logic value complementary with a logic value carried by the complementary bit line BB20. The bit line BL21 is configured to carry a logic value complementary with a logic value carried by the complementary bit line BB21. The bit line BL22 is configured to carry a logic value complementary with a logic value carried by the complementary bit line BB22. The bit line BL23 is configured to carry a logic value complementary with a logic value carried by the complementary bit line BB23.

As illustratively shown in FIG. 1B, control terminals of the switches J10 and JB10 are coupled to each other and configured to receive the control signal YB0. Control terminals of the switches J11 and JB11 are coupled to each other and configured to receive the control signal YB1. Control terminals of the switches J12 and JB12 are coupled to each other and configured to receive the control signal YB2. Control terminals of the switches J13 and JB13 are coupled to each other and configured to receive the control signal YB3.

As illustratively shown in FIG. 1B, the switches JD11 and JD12 are configured to receive the data signals DTB2 and DCB2, respectively, from the logic circuit 141. Referring to FIG. 1A and FIG. 1B, in some embodiment, a control terminal of the switch JD11 is coupled to an output terminal of the inverter IN4, and a control terminal of the switch JD12 is coupled to an output terminal of the inverter IN3.

Referring to FIG. 1A and FIG. 1B, a fifth memory cell in the memory bank 130 is coupled to the bit lines BL20 and BB20, and configured to be written according to the data signals DT1, DC1 and bit line signals of the bit lines BL20 and BB20. A sixth memory cell in the memory bank 130 is coupled to the bit lines BL21 and BB21, and configured to be written according to the data signals DT1, DC1 and bit line signals of the bit lines BL21 and BB21. A seventh memory cell in the memory bank 130 is coupled to the bit lines BL22 and BB22, and configured to be written according to the data signals DT1, DC1 and bit line signals of the bit lines BL22 and BB22. An eighth memory cell in the memory bank 130 is coupled to the bit lines BL23 and BB23, and configured to be written according to the data signals DT1, DC1 and bit line signals of the bit lines BL23 and BB23.

In some embodiments, the control signals YJ10-YJ13 indicate states of corresponding memory cells of the memory bank 130. When one of the control signals YJ10-YJ13 has the first logic value, corresponding one of the fifth to eighth memory cells performs a write operation. When one of the control signals YJ10-YJ13 has the second logic value, the corresponding one of the fifth to eighth memory cells is idle. For example, when the control signals YJ10-YJ13 have logic values of 0, 0, 0, 1, respectively, the eighth memory cell is written, and each of the fifth to seventh memory cells is not being written.

In some embodiments, the data signals DTB2 and DCB2 indicate a logic value to be written into one of the fifth to eighth memory cell. A logic value of the data signal DTB2 is complementary with a logic value of the data signal DCB2. For example, when each of the data signal DCB2 and the control signal YJ12 has the logic value of 1, each of the data signals DC1 and DTB1 has the logic value of 0, and the data signal DT1 has the logic value of 1. Correspondingly, the seventh memory cell coupled to the bit lines BL22 and BB22 is written according to the data signal DT1, and has the logic value of 1. At this moment, each of the switches JD12 and JB12 is turned on to provide the reference voltage signal NVSS to the bit line BB22. Accordingly, the voltage level of the bit line BB22 is adjusted to the voltage level VL.

FIG. 2 is a timing diagram 200 associated with the signals of the semiconductor device 100 shown in FIG. 1A, in accordance with some embodiments of the present disclosure. As illustratively shown in FIG. 2, the timing diagram 200 includes period P21-P23 arranged continuously in order.

As illustratively shown in FIG. 2, during the period P21, each of data signals DTB1 and DCB1 has the voltage level VL. Accordingly, referring to FIG. 1B and FIG. 2, each of the switches TD11 and TD12 is turned off. Each of the bit lines BL10-BL13 and BB10-BB13 has a voltage level VH. In some embodiments, the voltage level VL corresponds to the logic value of 0, and the voltage level VH corresponds to the logic value of 1. In some embodiments, the voltage level VL is lower than the voltage level VH.

As illustratively shown in FIG. 2, during the period P22, each of data signal DCB1 and the control signals YT0-YT2 has the voltage level VL, and the each of data signal DTB1 and the control signal YT3 has the voltage level VH. Accordingly, referring to FIG. 1B and FIG. 2, each of the switches T10-T12 and TD12 is turned off, and each of the switches T13 and TD11 is turned on to provide the reference voltage signal NVSS to the bit line BL13. At this moment, the voltage level of the bit line BL13 is adjusted to the voltage level VL of the reference voltage signal NVSS. The voltage levels of bit lines BL10-BL12 and BB10-BB12 are floated, and the bit line BB13 has the voltage level VH.

Referring to FIG. 1B and FIG. 2, the control signal YT3 having the voltage level VH indicates that the fourth memory cell coupled to the bit lines BL13 and BB13 is written. Alternatively stated, the bit lines BL13 and BB13 are selected by the control signal YT3, and the bit lines BL10-BL12 and BB10-BB12 are not selected. The data signal DTB1 has the logic value of 1 indicates that the data signal DT1 has the logic value of 0. Accordingly, the fourth memory cell is written according to the data signal DT1, and has the logic value of 0.

As illustratively shown in FIG. 2, during the period P23, each of data signals DTB1 and DCB1 has the voltage level VL. Accordingly, referring to FIG. 1B and FIG. 2, each of the switches TD11 and TD12 is turned off. Each of the bit lines BL10-BL13 and BB10-BB13 has a voltage level VH.

In some embodiments, the periods P21 and P23 correspond to an idle state of the memory bank 110 shown in FIG. 1A, and the period P22 corresponds to a write state of the memory bank 110. The memory bank 110 does not perform the write operations at the idle state.

In various embodiments, during the period P22, one of the control signals YT0-YT3 and one of the signals DTB1, DCB1 have the voltage level VH, to turn on a corresponding one of the switches T10-T13, TB10-TB13 and a corresponding one of the switches TD11, TD12. Accordingly, the reference voltage signal NVSS is provided to a corresponding one of the bit lines BL10-BL13 and BB10-BB13, to adjust a voltage level of the corresponding one of the bit lines BL10-BL13 and BB10-BB13 to the voltage level VL.

Referring to FIG. 1A, FIG. 1B and FIG. 2, the write driver 140 and the memory bank 120 also configured to operate in a similar manner with the write driver 130 and the memory bank 110. The switches T10-T13, TB10-TB13, TD11 and TD12 correspond to switches J10-J13, JB10-JB13, JD11 and JD12, respectively. The data signals DTB1, DCB1 and the control signals YT0-YT3 correspond to the data signals DTB2, DCB2 and the control signals YB0-YB3, respectively. The bit lines BL10-BL13 and BB10-BB13 correspond to the bit lines BL20-BL23 and BB20-BB23, respectively. Therefore, some descriptions are not repeated for brevity.

For example, during the period P22, each of the data signal DTB2 and the control signal YB3 has the voltage level VH to turn on the switches JD11 and J13, to adjust the voltage level of the bit line BL23 to the voltage level VL. At this moment, the eighth memory cell coupled to the bit line BL23 is written according to the data signal DT1 having the logic value of 0.

Figure 3:
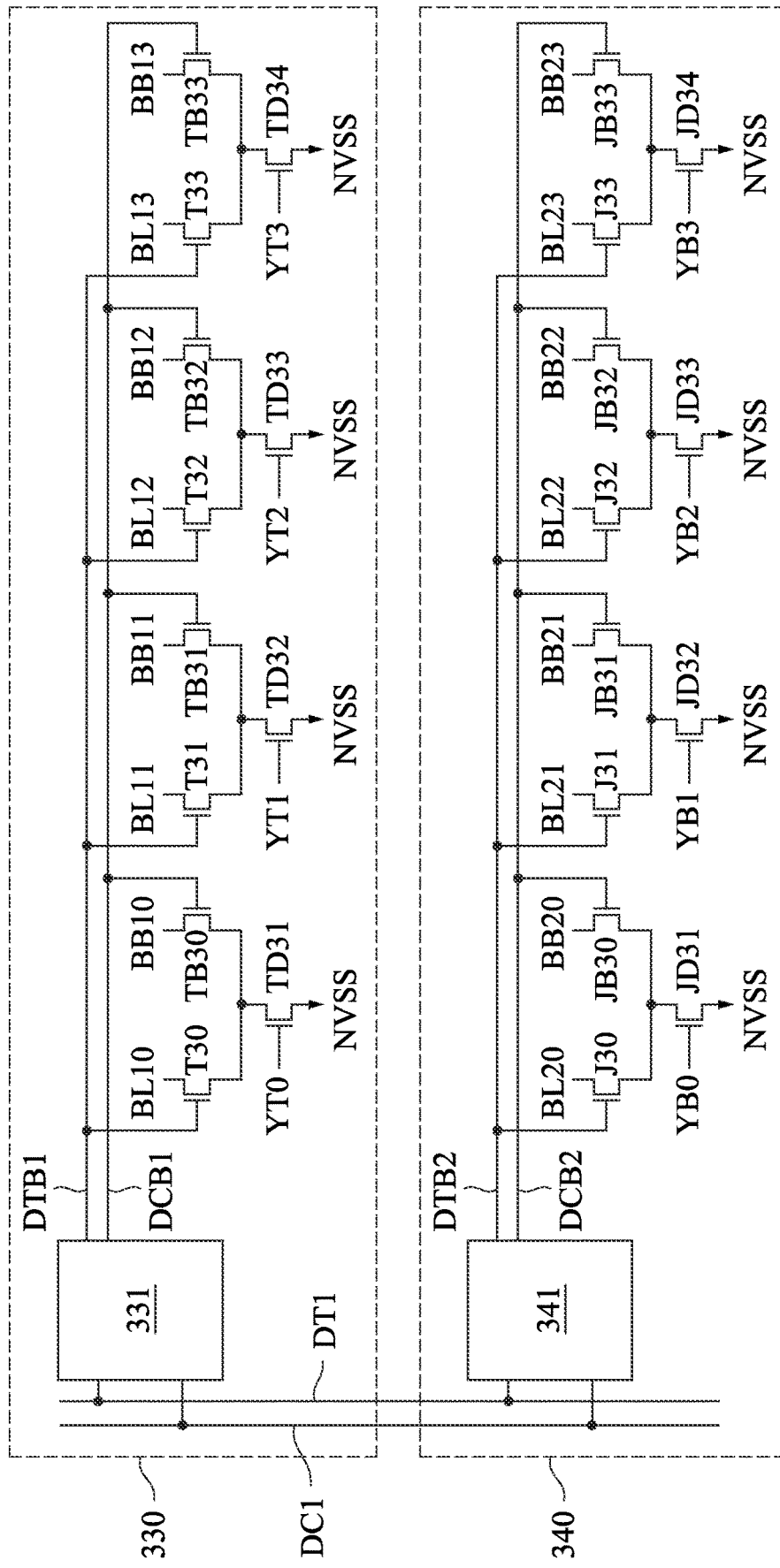
FIG. 3 is a circuit diagram of write drivers of a semiconductor device associated with the semiconductor device shown in FIG. 1A, in accordance with some embodiments of the present disclosure.

FIG. 3 is a circuit diagram of write drivers 330 and 340 of a semiconductor device 300 associated with the semiconductor device 100 shown in FIG. 1A, in accordance with some embodiments of the present disclosure. As illustratively shown in FIG. 3, the semiconductor device 300 includes the write drivers 330 and 340. The write driver 330 includes a logic circuit 331, switches T30-T33, TB30-TB33 and TD31-TD34. The write driver 340 includes a logic circuit 341, switches J30-J33, JB30-JB33 and JD31-JD34.

Referring to FIG. 3 and FIG. 1A, the semiconductor device 300 is an alternative embodiment of the semiconductor device 100. Comparing with the semiconductor device 100, in the semiconductor device 300, the write drivers 130 and 140 are replaced by the write drivers 330 and 340. Alternatively stated, in the semiconductor device 300, the write drivers 330 and 340 are coupled to the memory banks 110 and 120, respectively, and the memory bank 120, the write driver 330, the memory bank 110 and the write driver 340 are arranged in order along the Y direction. The operations of the write drivers 330, 340 and the logic circuit 331, 341 are similar with the operations of the write drivers 130, 140 and the logic circuit 131, 141, respectively. Therefore, some descriptions are not repeated for brevity.

As illustratively shown in FIG. 3, first terminals of the switches T30-T33, TB30-TB33, J30-J33 and JB30-JB33 are coupled to the bit lines BL10-BL13, BB10-BB13, BL20-BL23 and BB20-BB23, respectively. It is noted that the bit lines BL10-BL13 and BB10-BB13 are coupled to the memory cells of the memory bank 110 shown in FIG. 1A, and the bit lines BL20-BL23 and BB20-BB23 are coupled to the memory cells of the memory bank 120 shown in FIG. 1A.

As illustratively shown in FIG. 3, each of control terminals of the switches T30-T33 is configured to receive the data signal DTB1, each of control terminals of the switches TB30-TB33 is configured to receive the data signal DCB1, each of control terminals of the switches J30-J33 is configured to receive the data signal DTB2, and each of control terminals of the switches JB30-JB33 is configured to receive the data signal DCB2.

As illustratively shown in FIG. 3, each of the second terminals of the switches T30 and TB30 is coupled to a first terminal of the switch TD31, each of the second terminals of the switches T31 and TB31 is coupled to a first terminal of the switch TD32, each of the second terminals of the switches T32 and TB32 is coupled to a first terminal of the switch TD33, and each of the second terminals of the switches T33 and TB33 is coupled to a first terminal of the switch TD34.

As illustratively shown in FIG. 3, each of the second terminals of the switches J30 and JB30 is coupled to a first terminal of the switch JD31, each of the second terminals of the switches J31 and JB31 is coupled to a first terminal of the switch JD32, each of the second terminals of the switches J32 and JB32 is coupled to a first terminal of the switch JD33, and each of the second terminals of the switches J33 and JB33 is coupled to a first terminal of the switch JD34.

As illustratively shown in FIG. 3, control terminals of the switches TD31-TD34 and JD31-JD34 are configured to receive the control signals YT0-YT3 and YB0-YB3, respectively. Each of the second terminals of the switches TD31-TD34 and JD31-JD34 is configured to receive the reference voltage signal NVSS.

As illustratively shown in FIG. 3, the logic circuit 331 is configured to generate the data signals DTB1 and DCB1 according to the data signals DT1 and DC1, and the logic circuit 341 is configured to generate the data signals DTB2 and DCB2 according to the data signals DT1 and DC1. Referring to FIG. 3 and FIG. 1A, in some embodiment, the logic circuit 331 includes the inverters IN1 and IN2, and the logic circuit 341 includes the inverters IN3 and IN4. The control terminals of the switches T30-T33 are coupled to the output terminal of the inverter IN2, the control terminals of the switches TB30-TB33 are coupled to the output terminal of the inverter IN1, the control terminals of the switches J30-J33 are coupled to the output terminal of the inverter IN4, and the control terminals of the switches JB30-JB33 are coupled to the output terminal of the inverter IN3.

Referring to FIG. 3 and FIG. 2, during the period P21, each of data signals DTB1 and DCB1 has the voltage level VL. Accordingly, each of the switches T30-T33 and TB30-TB33 is turned off. Each of the bit lines BL30-BL33 and BB30-BB33 has a voltage level VH.

Referring to FIG. 3 and FIG. 2, during the period P22, each of data signal DCB1 and the control signals YT0-YT2 has the voltage level VL, and the each of data signal DTB1 and the control signal YT3 has the voltage level VH. Accordingly, each of the switches TB30-TB33 and TD31-TD33 is turned off, and each of the switches T33 and TD34 is turned on to provide the reference voltage signal NVSS to the bit line BL13. At this moment, the voltage level of the bit line BL13 is adjusted to the voltage level VL of the reference voltage signal NVSS. The voltage levels of bit lines BL10-BL12 and BB10-BB12 are floated. The bit line BB13 has the voltage level VH.

In various embodiments, during the period P22, one of the control signals YT0-YT3 and one of the signals DTB1, DCB1 have the voltage level VH, to turn on a corresponding one of the switches TD31-TD34 and a corresponding one of the switches T30-T33 and TB30-TB33. Accordingly, the reference voltage signal NVSS is provided to a corresponding one of the bit lines BL10-BL13 and BB10-BB13, to adjust a voltage level of the corresponding one of the bit lines BL10-BL13 and BB10-BB13 to the voltage level VL.

Referring to FIG. 1A, FIG. 3 and FIG. 2, the write driver 340 and the memory bank 120 also configured to operate in a similar manner with the write driver 330 and the memory bank 110. The switches T30-T33, TB30-TB33 and TD31-TD34 correspond to switches J30-J33, JB30-JB33 and JD31-JD34, respectively. The data signals DTB1, DCB1 and the control signals YT0-YT3 correspond to the data signals DTB2, DCB2 and the control signals YB0-YB3, respectively. The bit lines BL10-BL13 and BB10-BB13 correspond to the bit lines BL20-BL23 and BB20-BB23, respectively. Therefore, some descriptions are not repeated for brevity.

For example, during the period P22, each of the data signal DTB2 and the control signal YB3 has the voltage level VH to turn on the switches JD34 and J33, to adjust the voltage level of the bit line BL23 to the voltage level VL. At this moment, the eighth memory cell coupled to the bit line BL23 is written according to the data signal DT1 having the logic value of 0.

Figure 4:
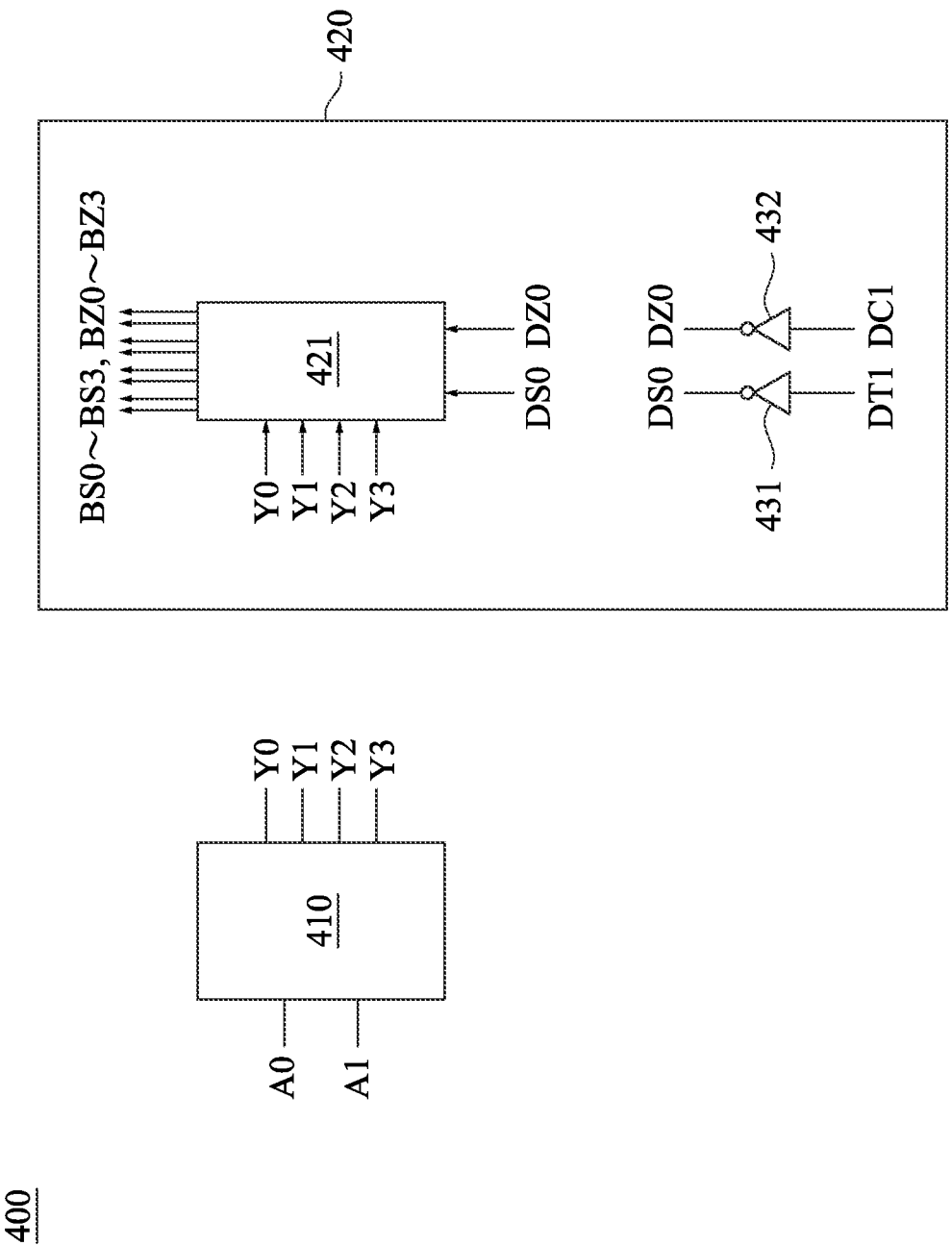
FIG. 4 is a schematic diagram a semiconductor device associated with the semiconductor device shown in FIG. 1A, in accordance with some embodiments of the present disclosure.

FIG. 4 is a schematic diagram a semiconductor device 400 associated with the semiconductor device 100 shown in FIG. 1A, in accordance with some embodiments of the present disclosure. As illustratively shown in FIG. 4, the semiconductor device 400 includes a decoder 410 and a write driver 420.

As illustratively shown in FIG. 4, the decoder 410 is configured to generate control signal Y0-Y3 according to address signals A0 and A1. In some embodiments, the address signals A0 and A1 have address bits indicating a bit line, such as one of bit lines BS0-BS3 and BZ0-BZ3, coupled to a memory cell being written, and a corresponding one of the control signals Y0-Y3 has the voltage level VH to adjust the bit line. In some embodiments, the decoder 410 is implemented by a 2 to 4 decoder.

As illustratively shown in FIG. 4, the write driver 420 includes inverters 431, 432 and an assisting circuit 421. The inverter 431 is configured to receive the data signal DT1 and output a data signal DS0. The inverter 432 is configured to receive the data signal DC1 and output a data signal DZ0.

The assisting circuit 421 is configured to adjust the voltage levels of the bit lines BS0-BS3 and BZ0-BZ3 according to the data signals DS0, DZ0 and the control signals Y0-Y3.

Referring to FIG. 4 and FIG. 1A, the semiconductor device 400 is an alternative embodiment of the semiconductor device 100. The address signals A0 and A1 correspond to the control signal YM. The decoder 410 corresponds to one of the buffers BC11 and BC12. The control signals Y0-Y3 correspond to the control signals YT0-YT3 or the control signals YB0-YB3. The inverters 431 and 432 correspond to the inverters IN2, IN1 or the inverters IN4, IN3. The data signal DS0 and DZ0 correspond to the data signals DTB1, DCB1 or the data signals DTB2, DCB2. Therefore, some descriptions are not repeated for brevity.

Referring to FIG. 4, FIG. 1B and FIG. 3, the write driver 420 corresponds to one of the write drivers 130, 140, 330 and 340. For example, the assisting circuit 421 includes switches having configurations of the switches T10-T13, TB10-TB13 and TD11-TD12, and the bit lines BS0-BS3 and BZ0-BZ3 correspond to the bit lines BL10-BL13 and BB10-BB13, respectively. For another example, the assisting circuit 421 includes switches having configurations of the switches J30-J33, JB30-JB33 and JD31-JD34, and the bit lines BS0-BS3 and BZ0-BZ3 correspond to the bit lines BL20-BL23 and BB20-BB23, respectively.

Figure 5:
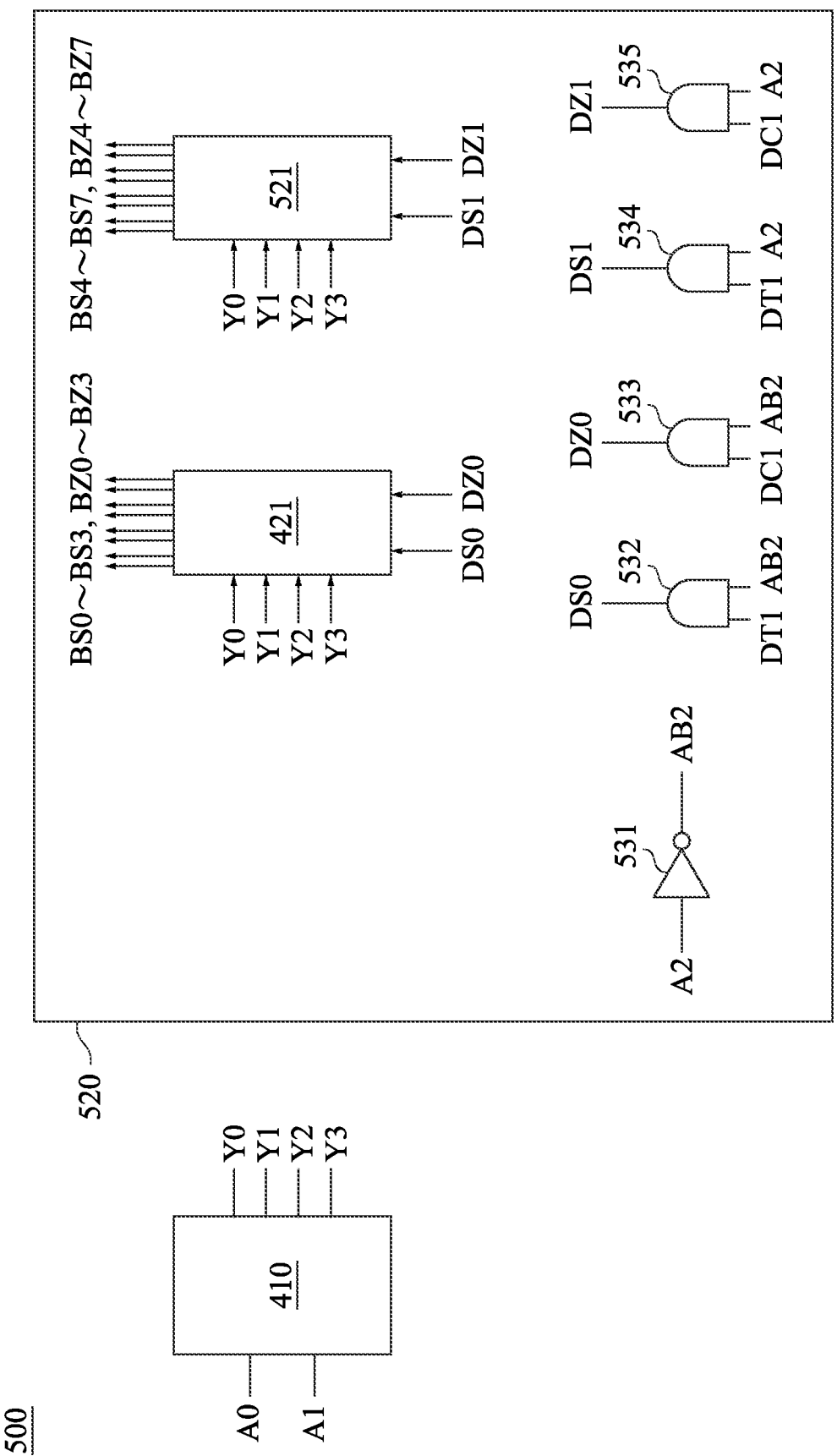
FIG. 5 is a schematic diagram a semiconductor device associated with the semiconductor device shown in FIG. 4, in accordance with some embodiments of the present disclosure.

FIG. 5 is a schematic diagram a semiconductor device 500 associated with the semiconductor device 400 shown in FIG. 4, in accordance with some embodiments of the present disclosure. Referring to FIG. 4 and FIG. 5, the semiconductor device 500 is an alternative embodiment of the semiconductor device 400. FIG. 5 follows a similar labeling convention to that of FIG. 4. For brevity, the discussion will focus more on differences between FIG. 4 and FIG. 5 than on similarities.

As illustratively shown in FIG. 5, the semiconductor device 500 includes the decoder 410 and a write driver 520. The write driver 520 includes the assisting circuit 421, an assisting circuit 521, an inverter 531 and AND logic gates 532-535. The operations and configurations of the decoder 410 and the assisting circuit 421 are described above in the embodiments associated with FIG. 4, and thus not repeated for brevity.

As illustratively shown in FIG. 5, the inverter 531 is configured to receive an address signal A2 and output an address signal AB2. The AND logic gate 532 is configured to receive the address signal AB2 and the data signal DT1, and output the data signal DS0. The AND logic gate 533 is configured to receive the address signal AB2 and the data signal DC1, and output the data signal DZ0. The AND logic gate 534 is configured to receive the address signal A2 and the data signal DT1, and output a data signal DS1. The AND logic gate 535 is configured to receive the address signal A2 and the data signal DC1, and output a data signal DZ1. The assisting circuit 521 is configured to adjust voltage levels of bit lines BS4-BS7 and BZ4-BZ7 according to the data signals DS1, DZ1 and the control signals Y0-Y3.

In some embodiments, configurations and operations of the assisting circuit 521 is similar with the configurations and the operations of the assisting circuit 421. The data signals DS1 and DZ1 correspond to the data signals DS0 and DZ0, respectively. The bit lines BS4-BS7 and BZ4-BZ7 correspond to the bit lines BS0-BS3 and BZ0-BZ3, respectively. In some embodiments, the bit lines BS4-BS7 and BZ4-BZ7 are coupled to the memory cells in the memory bank 110 or the memory bank 120. In some embodiments, the address signals A0 and A1 also have address bits indicating at least one bit line of the bit lines BS4-BS7 and BZ4-BZ7 coupled to a memory cell being written, and a corresponding one of the control signals Y0-Y3 has the voltage level VH to adjust the at least one bit line.

Referring to FIG. 5 and FIG. 1A, the semiconductor device 500 is an alternative embodiment of the semiconductor device 100. The inverter 531 and the AND logic gates 532-535 correspond to one the logic circuits 131 and 141. The data signal DS1 and DZ1 correspond to the data signals DTB1, DCB1 or the data signals DTB2, DCB2. Therefore, some descriptions are not repeated for brevity.

Referring to FIG. 5, FIG. 1B and FIG. 3, the write driver 520 corresponds to one of the write drivers 130, 140, 330 and 340. For example, the assisting circuit 521 includes switches having configurations of the switches T10-T13, TB10-TB13 and TD11-TD12, and the bit lines BS4-BS7 and BZ4-BZ7 correspond to the bit lines BL10-BL13 and BB10-BB13, respectively. For another example, the assisting circuit 521 includes switches having configurations of the switches J30-J33, JB30-JB33 and JD31-JD34, and the bit lines BS4-BS7 and BZ4-BZ7 correspond to the bit lines BL20-BL23 and BB20-BB23, respectively.

Figure 6:
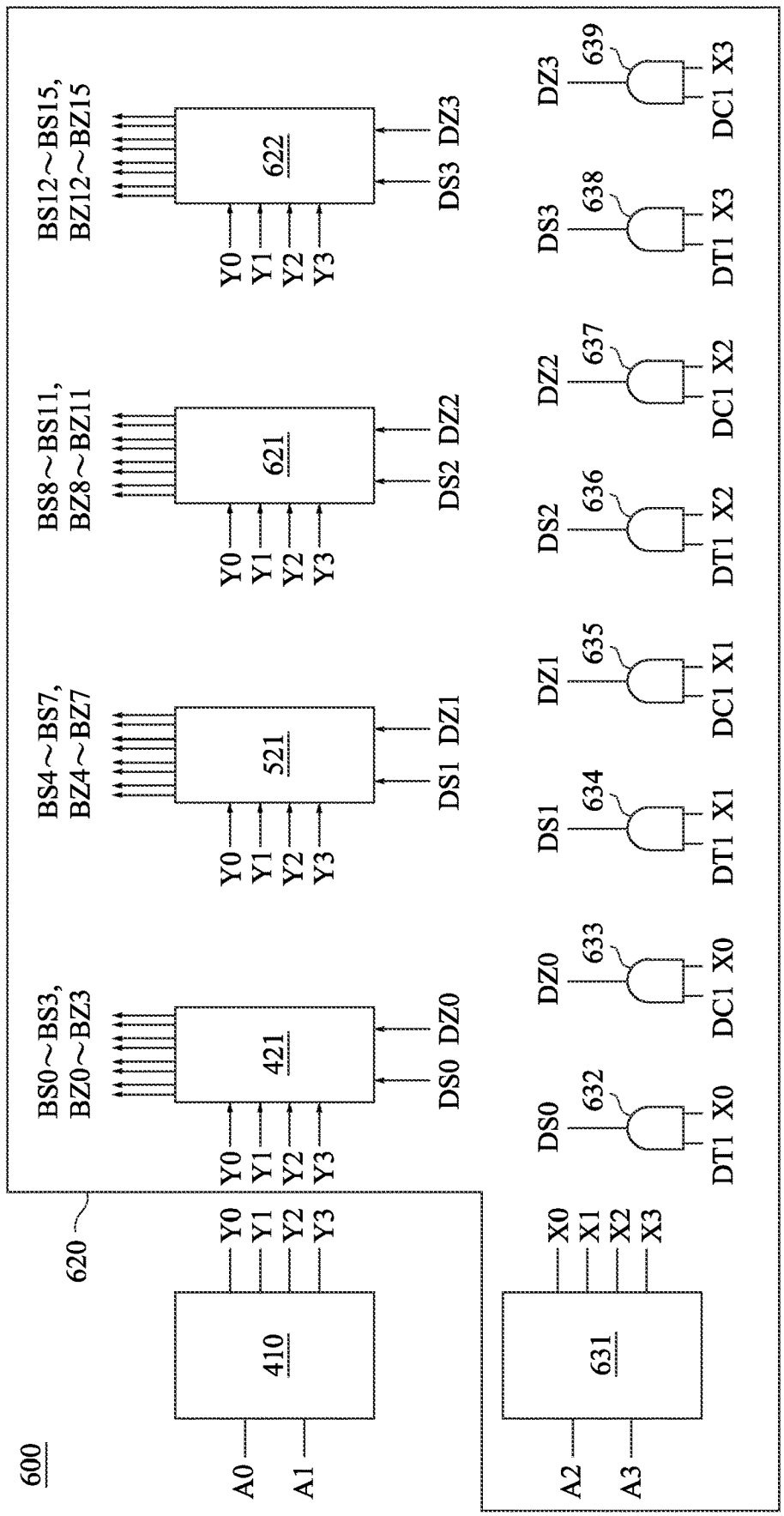
FIG. 6 is a schematic diagram a semiconductor device associated with the semiconductor device shown in FIG. 5, in accordance with some embodiments of the present disclosure.

FIG. 6 is a schematic diagram a semiconductor device 600 associated with the semiconductor device 500 shown in FIG. 5, in accordance with some embodiments of the present disclosure. Referring to FIG. 5 and FIG. 6, the semiconductor device 600 is an alternative embodiment of the semiconductor device 500. FIG. 6 follows a similar labeling convention to that of FIG. 5. For brevity, the discussion will focus more on differences between FIG. 5 and FIG. 6 than on similarities.

As illustratively shown in FIG. 6, the semiconductor device 600 includes the decoder 410 and a write driver 620. The write driver 620 includes the assisting circuits 421, 521, assisting circuits 621, 622, a decoder 631 and AND logic gates 632-639. The operations and configurations of the decoder 410 and the assisting circuits 421, 521 are described above in the embodiments associated with FIG. 5, and thus not repeated for brevity.

As illustratively shown in FIG. 6, the decoder 631 is configured to receive address signals A2 and A3, and output control signals X0-X3. In some embodiments, the address signals A2 and A3 have address bits indicating an assisting circuit, such as one of assisting circuits 421, 521, 621 and 622, coupled to a memory cell being written, and a corresponding one of the control signals X0-X3 has the voltage level VH to adjust a bit line coupled to the assisting circuit. In some embodiments, the decoder 631 is implemented by a 2 to 4 decoder.

As illustratively shown in FIG. 6, the AND logic gate 632 is configured to receive the control signal X0 and the data signal DT1, and output the data signal DS0. The AND logic gate 633 is configured to receive the control signal X0 and the data signal DC1, and output the data signal DZ0. The AND logic gate 634 is configured to receive the control signal X1 and the data signal DT1, and output the data signal DS1. The AND logic gate 635 is configured to receive the control signal X1 and the data signal DC1, and output the data signal DZ1. The AND logic gate 636 is configured to receive the control signal X2 and the data signal DT1, and output a data signal DS2. The AND logic gate 637 is configured to receive the control signal X2 and the data signal DC1, and output a data signal DZ2. The AND logic gate 638 is configured to receive the control signal X3 and the data signal DT1, and output a data signal DS3. The AND logic gate 639 is configured to receive the control signal X3 and the data signal DC1, and output a data signal DZ3.

As illustratively shown in FIG. 6, the assisting circuit 621 is configured to adjust voltage levels of the bit lines BS8-BS11 and BZ8-BZ11 according to the data signals DS2, DZ2 and the control signals Y0-Y3. The assisting circuit 622 is configured to adjust voltage levels of the bit lines BS12-BS15 and BZ12-BZ15 according to the data signals DS3, DZ3 and the control signals Y0-Y3.

In some embodiments, configurations and operations of the assisting circuit 621 is similar with the configurations and the operations of the assisting circuit 421. The data signals DS2 and DZ2 correspond to the data signals DS0 and DZ0, respectively. The bit lines BS8-BS11 and BZ8-BZ11 correspond to the bit lines BS0-BS3 and BZ0-BZ3, respectively. In some embodiments, the bit lines BS8-BS11 and BZ8-BZ11 are coupled to the memory cells in the memory bank 110 or the memory bank 120. In some embodiments, the address signals A0 and A1 also have address bits indicating at least one bit line of the bit lines BS8-BS11 and BZ8-BZ11 coupled to a memory cell being written, and a corresponding one of the control signals Y0-Y3 has the voltage level VH to adjust the at least one bit line.

In some embodiments, configurations and operations of the assisting circuit 622 is similar with the configurations and the operations of the assisting circuit 421. The data signals DS3 and DZ3 correspond to the data signals DS0 and DZ0, respectively. The bit lines BS12-BS15 and BZ12-BZ15 correspond to the bit lines BS0-BS3 and BZ0-BZ3, respectively. In some embodiments, the bit lines BS12-BS15 and BZ12-BZ15 are coupled to the memory cells in the memory bank 110 or the memory bank 120. In some embodiments, the address signals A0 and A1 also have address bits indicating at least one bit line of the bit lines BS12-BS15 and BZ12-BZ15 coupled to a memory cell being written, and a corresponding one of the control signals Y0-Y3 has the voltage level VH to adjust the at least one bit line.

Referring to FIG. 6 and FIG. 1A, the semiconductor device 600 is an alternative embodiment of the semiconductor device 100. The decoder 631 and the AND logic gates 632-639 correspond to one the logic circuits 131 and 141. The data signal DS2 and DZ2 correspond to the data signals DTB1, DCB1 or the data signals DTB2, DCB2. The data signal DS3 and DZ3 also correspond to the data signals DTB1, DCB1 or the data signals DTB2, DCB2. Therefore, some descriptions are not repeated for brevity.

Referring to FIG. 6, FIG. 1B and FIG. 3, the write driver 620 corresponds to one of the write drivers 130, 140, 330 and 340. For example, each of the assisting circuits 621 and 622 includes switches having configurations of the switches T10-T13, TB10-TB13 and TD11-TD12. For another example, each of the assisting circuits 621 and 622 includes switches having configurations of the switches J30-J33, JB30-JB33 and JD31-JD34.

Also disclosed is a semiconductor device. The semiconductor device includes a first memory bank, a second memory bank and a first write driver. The first memory bank is coupled to a plurality of first data lines, and configured to operate according to a first data signal. The second memory bank is configured to operate according to the first data signal. The first write driver is disposed between the first memory bank and the second memory bank, and configured to adjust a voltage level of one of the plurality of first data lines when the first memory bank is written according to the first data signal.

Also disclosed is a semiconductor device. The semiconductor device includes a first logic circuit, a second logic circuit, a first switch, a second switch and a third switch. The first logic circuit is configured to generate a first data signal according to a second data signal. The second logic circuit is configured to generate a third data signal according to the second data signal. The first switch is configured to be turned on according to the first data signal, to adjust a voltage level of a first data line to a reference voltage level when a first memory cell coupled to the first data line is written according to the second data signal. The second switch is configured to be turned on according to the third data signal, to adjust a voltage level of a second data line to the reference voltage level when a second memory cell coupled to the second data line is written according to the second data signal. The third switch is coupled in series with the first switch, and is configured to provide a reference voltage signal having the reference voltage level to the first switch.

Also disclosed is a method. The method includes: adjusting, by a first write driver, a voltage level of a first data line of a plurality of first data lines, when a first memory bank which is coupled to the plurality of first data lines is written according to a first data signal; and adjusting, by a second write driver, a voltage level of a second data line of a plurality of second data lines when a second memory bank which is coupled to the plurality of second data lines is written according to the first data signal. In some embodiments, the first memory bank is disposed between the first write driver and the second write driver, and the second write driver is disposed between the first memory bank and the second memory bank.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first memory bank coupled to a plurality of first data lines, and configured to operate according to a first data signal;
   a second memory bank configured to operate according to the first data signal; and
   a first write driver disposed between the first memory bank and the second memory bank, and configured to adjust a voltage level of one of the plurality of first data lines when the first memory bank is written according to the first data signal.

2. The semiconductor device of claim 1, further comprising:
   a second write driver configured to adjust a voltage level of one of a plurality of second data lines when the second memory bank is written according to the first data signal,
   wherein the second memory bank is disposed between the first write driver and the second write driver, and is coupled to the plurality of second data lines.

3. The semiconductor device of claim 1, wherein the first write driver comprises:
   a first switch coupled to a first data line of the plurality of first data lines, and configured to be turned on when a first memory cell of the first memory bank is written according to the first data signal; and
   a second switch coupled in series with the first switch, configured to be turned on in response to the first data signal having a first logic value for the first memory cell, and configured to be turned off in response to the first data signal having a second logic value for the first memory cell,
   wherein the first logic value is different from the second logic value, and
   the first data line is coupled to the first memory cell.

4. The semiconductor device of claim 3, wherein the first write driver further comprises:
   a third switch coupled to a first complementary data line of the plurality of first data lines, and configured to be turned on when the first memory cell is written according to the first data signal; and
   a fourth switch coupled in series with the third switch, configured to be turn off when the second switch is turned on,
   wherein a logic value of the first complementary data line and a logic value of the first data line are complementary with each other, and
   the first complementary data line is coupled to the first memory cell.

5. The semiconductor device of claim 3, wherein the first write driver further comprises:
   a third switch coupled to a second data line of the plurality of first data lines, coupled in series with the second switch, and configured to be turned on when a second memory cell of the first memory bank is written according to the first data signal,
   wherein the second data line is coupled to the second memory cell.

6. The semiconductor device of claim 1, wherein the first write driver comprises:
   a first switch configured to be turned on when a first memory cell of the first memory bank is written according to the first data signal; and
   a second switch coupled to a first data line of the plurality of first data lines, coupled in series with the first switch, configured to be turned on in response to the first data signal having a first logic value for the first memory cell, and configured to be turned off in response to the first data signal having a second logic value for the first memory cell,
   wherein the first logic value is different from the second logic value, and
   the first data line is coupled to the first memory cell.

7. The semiconductor device of claim 6, wherein the first write driver further comprises:
   a third switch coupled to a first complementary data line of the plurality of first data lines, coupled in series with the first switch, and configured to be turned off when the second switch is turned on,
   wherein a logic value of the first complementary data line and a logic value of the first data line are complementary with each other, and
   the first complementary data line is coupled to the first memory cell.

8. The semiconductor device of claim 6, wherein the first write driver comprises:
   a third switch configured to be turned on when a second memory cell of the first memory bank is written according to the first data signal; and
   a fourth switch coupled to a second data line of the plurality of first data lines, coupled in series with the third switch, configured to be turned on in response to the first data signal having the first logic value for the second memory cell, and configured to be turned off in response to the first data signal having the second logic value for the second memory cell,
wherein the second data line is coupled to the second memory cell.

9. The semiconductor device of claim 1, wherein the first write driver comprises:
a first logic element configured to generate a second data signal according to an first address signal and the first data signal;
a second logic element configured to generate a third data signal according to the first address signal and the first data signal;
a first assisting circuit configured to adjust one of the plurality of first data lines according to the second data signal and a second address signal; and
a second assisting circuit configured to adjust another one of the plurality of first data lines according to the third data signal and the second address signal.

10. A method, comprising:
adjusting, by a first write driver, a voltage level of a first data line of a plurality of first data lines, when a first memory bank which is coupled to the plurality of first data lines is written according to a first data signal; and
adjusting, by a second write driver, a voltage level of a second data line of a plurality of second data lines when a second memory bank which is coupled to the plurality of second data lines is written according to the first data signal,
wherein the first memory bank is disposed between the first write driver and the second write driver, and
the second write driver is disposed between the first memory bank and the second memory bank.

11. The method of claim 10, wherein
adjusting the voltage level of the first data line comprises:
turning on a first switch and a second switch coupled in series;
generating, by a first inverter, a second data signal according to the first data signal; and
providing the second data signal to a control terminal of the first switch, adjusting the voltage level of the second data line comprises:
turning on a third switch and a fourth switch coupled in series;
generating, by a second inverter, a third data signal according to the first data signal; and
providing the third data signal to a control terminal of the third switch, and
the second switch and the fourth switch are coupled to the first data line and the second data line, respectively.

12. The method of claim 11, further comprising:
when the second switch is turned on, turning on a fifth switch coupled to a first complementary data line;
when the first switch is turned off, turning on a sixth switch coupled in series with the fifth switch;
providing a reference voltage signal to the first data line through the first switch and the second switch; and
providing the reference voltage signal to the first complementary data line through the fifth switch and the sixth switch,
wherein a logic value of the first complementary data line is complementary with a logic value of the first data line.

13. The method of claim 10, wherein
adjusting the voltage level of the first data line comprises:
turning on a first switch and a second switch coupled in series;
generating, by a first inverter, a second data signal according to the first data signal;
providing the second data signal to a control terminal of the first switch; and
providing, by the second switch, a reference voltage signal to the first switch, adjusting the voltage level of the second data line comprises:
turning on a third switch and a fourth switch coupled in series;
generating, by a second inverter, a third data signal according to the first data signal;
providing the third data signal to a control terminal of the third switch, and
providing, by the fourth switch, the reference voltage signal to the third switch, and
the first switch and the third switch are coupled to the first data line and the second data line, respectively.

14. The method of claim 13, further comprising:
when the first switch is turned off, turning on a fifth switch coupled in series with the second switch, to provide the reference voltage signal to a first complementary data line of the plurality of first data lines,
wherein a logic value of the first complementary data line is complementary with a logic value of the first data line.

15. The method of claim 14, further comprising:
when the first switch is turned on, turning on a sixth switch coupled in series with a seventh switch;
when the fifth switch is turned on, turning on an eighth switch coupled in series with the seventh switch; and
when the second switch is turned off, providing the reference voltage signal to each of the sixth switch and the eighth switch by the seventh switch.

16. A semiconductor device, comprising:
a first memory bank coupled to a plurality of first data lines, and configured to operate according to a first data signal;
a second memory bank coupled to a plurality of second data lines, and configured to operate according to the first data signal; and
a first write driver disposed between the first memory bank and the second memory bank, and configured to adjust a voltage level of one of the plurality of first data lines when the first memory bank is written according to the first data signal; and
a second write driver configured to adjust a voltage level of one of the plurality of second data lines when the second memory bank is written according to the first data signal.

17. The semiconductor device of claim 16, wherein the second memory bank is disposed between the first write driver and the second write driver.

18. The semiconductor device of claim 16, wherein the first write driver comprises:
a first switch coupled to a first data line of the plurality of first data lines, and configured to be turned on when a first memory cell of the first memory bank is written according to the first data signal; and
a second switch coupled in series with the first switch, configured to be turned on in response to the first data signal having a first logic value for the first memory cell, and configured to be turned off in response to the first data signal having a second logic value for the first memory cell, wherein the first logic value is different from the second logic value, and the first data line is coupled to the first memory cell.

19. The semiconductor device of claim 16, wherein the first write driver comprises:

a first switch configured to be turned on when a first memory cell of the first memory bank is written according to the first data signal; and a second switch coupled to a first data line of the plurality of first data lines, coupled in series with the first switch, configured to be turned on in response to the first data signal having a first logic value for the first memory cell, and configured to be turned off in response to the first data signal having a second logic value for the first memory cell, wherein the first logic value is different from the second logic value, and the first data line is coupled to the first memory cell.

20. The semiconductor device of claim 16, wherein the first write driver comprises:

a first logic element configured to generate a second data signal according to an first address signal and the first data signal;

a second logic element configured to generate a third data signal according to the first address signal and the first data signal;

a first assisting circuit configured to adjust one of the plurality of first data lines according to the second data signal and a second address signal; and a second assisting circuit configured to adjust another one of the plurality of first data lines according to the third data signal and the second address signal.

* * * * *